(12) United States Patent
Kim et al.

(10) Patent No.: US 9,540,547 B2
(45) Date of Patent: Jan. 10, 2017

(54) COMPOSITION FOR FORMING ADHESIVE LAYER OF DICING FILM, AND DICING FILM

(71) Applicant: LG CHEM, LTD., Seoul (KR)

(72) Inventors: Young Kook Kim, Daejeon (KR); Se Ra Kim, Daejeon (KR); Hee Jung Kim, Daejeon (KR); Jung Ho Jo, Daejeon (KR); Kwang Joo Lee, Daejeon (KR); Jung Hak Kim, Daejeon (KR); Seung Hee Nam, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/781,507

(22) PCT Filed: Dec. 12, 2014

(86) PCT No.: PCT/KR2014/012283
§ 371 (c)(1),
(2) Date: Sep. 30, 2015

(87) PCT Pub. No.: WO2015/088282
PCT Pub. Date: Jun. 18, 2015

(65) Prior Publication Data
US 2016/0040042 A1 Feb. 11, 2016

(30) Foreign Application Priority Data

Dec. 13, 2013 (KR) .......................... 10-2013-0155590
Dec. 11, 2014 (KR) .......................... 10-2014-0178601

(51) Int. Cl.
| | | |
|---|---|---|
| C09J 11/08 | (2006.01) | |
| H01L 21/26 | (2006.01) | |
| H01L 21/78 | (2006.01) | |
| C09J 133/00 | (2006.01) | |
| C09J 7/02 | (2006.01) | |
| C09J 5/00 | (2006.01) | |
| H01L 21/683 | (2006.01) | |
| H01L 23/00 | (2006.01) | |

(52) U.S. Cl.
CPC . *C09J 11/08* (2013.01); *C09J 5/00* (2013.01); *C09J 7/02* (2013.01); *C09J 133/00* (2013.01); *H01L 21/26* (2013.01); *H01L 21/6836* (2013.01); *H01L 21/78* (2013.01); *H01L 24/27* (2013.01); *H01L 24/29* (2013.01); *H01L 24/83* (2013.01); *H01L 24/94* (2013.01); *C09J 2201/128* (2013.01); *C09J 2201/606* (2013.01); *C09J 2203/326* (2013.01); *C09J 2205/302* (2013.01); *C09J 2205/31* (2013.01); *C09J 2433/00* (2013.01); *C09J 2463/00* (2013.01); *C09J 2475/00* (2013.01); *C09J 2483/00* (2013.01); *H01L 24/32* (2013.01); *H01L 24/48* (2013.01); *H01L 24/92* (2013.01); *H01L 2221/68336* (2013.01); *H01L 2221/68377* (2013.01); *H01L 2221/68381* (2013.01); *H01L 2224/271* (2013.01); *H01L 2224/27003* (2013.01); *H01L 2224/27436* (2013.01); *H01L 2224/2919* (2013.01); *H01L 2224/32145* (2013.01); *H01L 2224/32225* (2013.01); *H01L 2224/48227* (2013.01); *H01L 2224/73265* (2013.01); *H01L 2224/83203* (2013.01); *H01L 2224/83204* (2013.01); *H01L 2224/83862* (2013.01); *H01L 2224/92* (2013.01); *H01L 2224/92247* (2013.01); *H01L 2224/94* (2013.01); *H01L 2924/3512* (2013.01)

(58) Field of Classification Search
CPC ...... H01L 21/78; H01L 21/26; H01L 21/6836; H01L 24/27; H01L 24/29; H01L 24/83; H01L 24/94; C09J 5/00; C09J 7/02; C09J 11/08; C09J 133/00
See application file for complete search history.

(56) References Cited

U.S. PATENT DOCUMENTS

| | | | |
|---|---|---|---|
| 8,616,675 B2 | 12/2013 | Casella et al. | |
| 2009/0075008 A1* | 3/2009 | Hwang | C09J 133/14 428/41.7 |
| 2014/0154868 A1* | 6/2014 | Sugo | H01L 21/6835 438/458 |

FOREIGN PATENT DOCUMENTS

| | | |
|---|---|---|
| JP | 2006-005159 A | 1/2006 |
| JP | 2011-009425 A | 1/2011 |
| JP | 2013-189646 A | 9/2013 |
| KR | 10-2009-0022722 A | 3/2009 |
| KR | 10-2010-0002160 A | 1/2010 |
| KR | 10-0945635 B1 | 3/2010 |
| KR | 10-1089631 B1 | 12/2011 |
| KR | 10-2012-0099238 A | 9/2012 |
| KR | 10-1270976 B1 | 6/2013 |
| KR | 10-2013-0102057 A | 9/2013 |
| WO | 2015-093794 A1 | 6/2015 |

OTHER PUBLICATIONS

International Search Report issued in corresponding application No. PCT/KR2014/12283 dated Mar. 31, 2015, 5 pages.

* cited by examiner

*Primary Examiner* — Daniel Shook
(74) *Attorney, Agent, or Firm* — Rothwell, Figg, Ernst & Manbeck, P.C.

(57) ABSTRACT

There are provided a composition for forming an adhesive layer of a dicing film including: a silicon compound oil including at least one reactive functional group; an adhesive binder; and a photoinitiator, wherein a weight ratio of the silicon compound oil including at least one reactive functional group to the adhesive binder is 0.01% to 4.5%, a dicing film including an adhesive layer including the composition, a dicing die bonding film including the dicing film, and a method for dicing a semiconductor wafer using the dicing die bonding film.

15 Claims, No Drawings

COMPOSITION FOR FORMING ADHESIVE LAYER OF DICING FILM, AND DICING FILM

FIELD OF THE INVENTION

The present invention relates to a composition for forming an adhesive layer of a dicing film, and a dicing film.

BACKGROUND OF THE INVENTION

In general, a process of manufacturing a semiconductor chip includes forming micropatterns on a wafer, and polishing the wafer so as to satisfy the standards of the final device and packaging.

The packaging process includes: a wafer inspection process for inspecting defects of semiconductor chips; a dicing process for cutting the wafer to separate into individual chips; a die bonding process for attaching the separated chips to the mounting plate of a lead frame or a circuit film; a wire bonding process for connecting a chip pad equipped on the semiconductor chip with the circuit pattern of a lead frame or a circuit film using an electrical connection means such as a wire; a molding process for covering the outside with an encapsulant so as to protect the internal circuit and other components of the semiconductor chip; a trim process for cutting a dambar connecting leads; a forming process for bending the lead to a desired shape; and a process of inspecting a finished product for inspecting defects of the finished package, and the like.

In the dicing process, a wafer is cut to a predetermined thickness using a diamond wheel and the like. Herein, to fix the wafer, a dicing film is laminated to the back side of the wafer under appropriate conditions, and then the process is progressed. To attach diced individual chips to a circuit board, a die bonding film (bonding film) is used.

Meanwhile, the dicing process includes the steps of cutting a semiconductor wafer with a dicing blade, irradiating UV to the base film of the semiconductor wafer, and picking up individual chips separated by the cutting of the semiconductor wafer, but there were problems in that fixation between films occurs during the pick-up process, and that due to excessive peel strength between films, a success rate of picking up chips is lowered or chip cracks are generated during pick-up.

DETAILED DESCRIPTION OF THE INVENTION

Technical Objectives

There is provided a composition for forming an adhesive layer of a dicing film for providing a dicing die bonding film that can prevent fixation between films in a dicing process to increase pick-up success rate, and exhibit relatively high die shear strength to prevent delamination due to degradation of adhesion strength.

There is also provided a dicing film using the above-explained composition for forming an adhesive layer of a dicing film.

There is also provided a dicing die bonding film including the dicing film.

There is also provided a method for dicing a semiconductor wafer using the dicing film.

Technical Solutions

An exemplary embodiment of the present invention provides an composition for forming an adhesive layer of a dicing film including a silicon compound oil including: at least one reactive functional group; an adhesive binder; and a photoinitiator, wherein the weight ratio of the silicon compound oil including at least one reactive functional group to the adhesive binder is 0.01% to 4.5%.

The reactive functional group may include at least one functional group selected from the group consisting of a hydroxyl group, a carbinol group, an epoxy, an amino group, a thiol group, and a carboxyl group.

The silicon compound oil including at least one reactive functional group may include: at least one silicon compound selected from the group consisting of a silicon compound of the following Chemical Formula 1, a silicon compound of the following Chemical Formula 2, and polyether modified hydroxy functional polydimethylsiloxane; and an organic solvent.

[Chemical Formula 1]

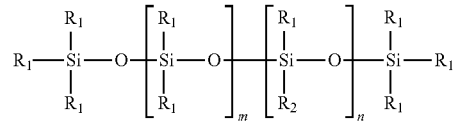

In Chemical Formula 1, $R_1$ is independently an alkyl group having a carbon number of 1 to 3, $R_2$ is a hydroxyl group, an alkylene alcohol having a carbon number of 1 to 10, an epoxy group, an amino group, a thiol group, or a carboxyl group, m is an integer of 0 to 500, and n is an integer of 1 to 500.

[Chemical Formula 2]

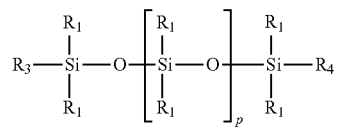

In Chemical Formula 2, $R_1$ is independently an alkyl group having a carbon number of 1 to 3; at least one of $R_3$ and $R_4$ is an alkyl group having a carbon number of 1 to 3, and the other is a hydroxyl group, an alkylene alcohol having a carbon number of 1 to 10, an epoxy group, an amino group, a thiol group, or a carboxyl group, or $R_3$ and $R_4$ are independently a hydroxyl group, an alkylene alcohol having a carbon number of 1 to 10, an epoxy group, an amino group, a thiol group, or a carboxyl group; and p is an integer of 0 to 500.

The organic solvent is selected from alcohols, ethers, acetates, or ketones.

The silicon compound oil including at least one reactive functional group may have a viscosity of 10 $mm^2/s$ to 20,000 $mm^2/s$ at 25° C.

The adhesive binder may include a (meth)acrylate polymer or a (meth)acrylate copolymer unsubstituted or substituted with at least one functional group selected from the group consisting of a hydroxyl group, an isocyanate group, a vinyl group, and a (meth)acrylate group.

The adhesive binder may include an embedded adhesive binder added with an acrylate having a carbon-carbon double bond to a main chain of a (meth)acrylate resin. For example, as the embedded adhesive binder, a polymer resin added with 1 wt % to 45 wt % of a (meth)acrylate functional group as a side chain to the main chain of (meth)acrylate base resin may be used.

The adhesive binder may include a polymer having a weight average molecular weight of 100,000 to 1,500,000.

The photoinitiator may include at least one selected from the group consisting of benzoins and alkylethers thereof, acetophenones, anthraquinones, thioxanthines, benzophenones, α-aminoacetophenones, acylphosphine oxides, and oxime esters.

The composition may include 0.01 to 8 parts by weight or 0.02 to 5 parts by weight of the photoinitiator, based on 100 parts by weight of the adhesive binder.

The composition for forming an adhesive layer of a dicing film may further include a curing agent.

The curing agent may include at least one selected from the group consisting of an isocyanate compound, an aziridine compound, an epoxy compound, and a metal chelate compound.

The composition for forming an adhesive layer of a dicing film may include 0.1 to 30 parts by weight of the curing agent, based on 100 parts by weight of the adhesive binder.

There is also provided is a dicing film including a base film and an adhesive layer formed on at least one side of the base film, wherein the adhesive layer includes the above-explained composition for forming an adhesive layer of a dicing film.

The thickness of the base film may be 10 μm to 200 μm, and the thickness of the adhesive layer may be 0.5 μm to 50 μm.

Also provided is a dicing die bonding film including the dicing film, and a bonding layer formed on at least one side of the dicing film.

Also provided is a method for dicing a semiconductor wafer including the steps of: conducting pre-treatment by partially treating a semiconductor wafer including the dicing die bonding film and a wafer laminated on at least one side of the dicing die bonding film so that it is completely cut or it can be cut; expanding the semiconductor wafer after the pre-treatment step; and irradiating UV to the base film of the expanded semiconductor wafer, and picking up individual chips separated by cutting of the semiconductor wafer.

Advantageous Effect of the Invention

A composition for forming an adhesive layer of a dicing film for providing a dicing die bonding film that can prevent fixation between films in a dicing process to increase pick-up success rate and exhibit relatively high die shear strength to prevent delamination due to degradation of adhesion strength, a dicing film including an adhesive layer including the composition, a dicing die bonding film including the dicing film, and a method for dicing a semiconductor wafer using the dicing die bonding film are provided.

DETAILED DESCRIPTION OF THE EMBODIMENTS

Hereinafter, a dicing film, a dicing die bonding film and a method for dicing a semiconductor wafer according to specific embodiments will be explained in detail.

According to one embodiment of the invention, a composition for forming an adhesive layer of a dicing film is provided, including: a silicon compound oil including at least one reactive functional group; an adhesive binder; and a photoinitiator, wherein the weight ratio of the silicon compound oil including at least one reactive functional group to the adhesive binder is 0.01% to 4.5%.

Previously, there was a problem in that a success rate of picking up of chips may be lowered due to fixation between films during a pick-up process in a dicing process and excessive peel strength.

Thus, the inventors confirmed through experiments that if a dicing film including an adhesive layer formed from a composition including a silicon compound oil including at least one reactive functional group in a specific content is used, fixation between films may be prevented and peel strength between films may be lowered to improve a success rate of picking up of chips, relatively high die shear strength may be exhibited to prevent delamination due to degradation of adhesion strength, and reliability of a semiconductor manufacturing process may be improved, and completed the invention.

The silicon compound including at least one reactive functional group that is included in the silicon compound oil including at least one reactive functional group has releasability to an organic or inorganic substance, and the alkyl group of a dimethyl siloxane moiety acts as a non-polar molecule to the surface of an adherend, and thus the silicon compound has releasability and a slip property to a polar adherend. Thus, the composition for forming an adhesive layer of a dicing film may afford higher releasability and slip property to a bonding layer (die bonding film) to facilitate delamination after UV curing.

The weight ratio of the silicon compound oil including at least one reactive functional group to the adhesive binder may be 0.01% to 4.5%, or 0.1% to 2%.

If the weight ratio of the silicon compound oil including at least one reactive functional group to the adhesive binder is too low, the adhesive layer of a dicing film prepared from the composition for forming an adhesive layer of a dicing film according to the above embodiment may have significantly increased peel strength, for example, significantly increased 180 degree peel strength and tack force before/after UV irradiation, and SUS peel strength.

If the weight ratio of the silicon compound oil including at least one reactive functional group to the adhesive binder is too high, although peel strength of the adhesive layer of a dicing film prepared from the composition for forming an adhesive layer of a dicing film according to the above embodiment may be lowered to some degree, die shear strength of the adhesive layer may be significantly decreased to generate delamination due to degradation of adhesion strength, and thus reliability may be decreased in a semiconductor manufacturing process.

Meanwhile, the silicon included in the silicon compound oil may include or be substituted with at least one reactive functional group, and specific examples thereof may include at least one functional group selected from the group consisting of a hydroxyl group, a carbinol group, an epoxy, an amino group, a thiol group, and a carboxyl group.

The silicon compound oil including at least one reactive functional group includes a silicon compound including at least one reactive functional group and an organic solvent.

Specifically, the silicon compound oil including at least one reactive functional group may include: at least one silicon compound selected from the group consisting of a silicon compound of the following Chemical Formula 1, a silicon compound of the following Chemical Formula 2, and polyether modified hydroxy functional polydimethylsiloxane; and an organic solvent.

[Chemical Formula 1]

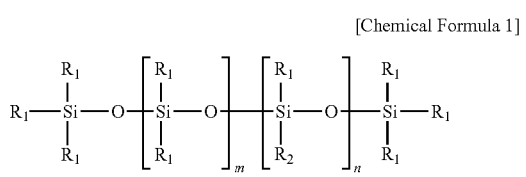

In Chemical Formula 1, $R_1$ is independently an alkyl group having a carbon number of 1 to 3, $R_2$ is a hydroxyl group, an alkylene alcohol having a carbon number of 1 to 10, an epoxy group, an amino group, a thiol group, or a carboxyl group, m is an integer of 0 to 500, and n is an integer of 1 to 500.

[Chemical Formula 2]

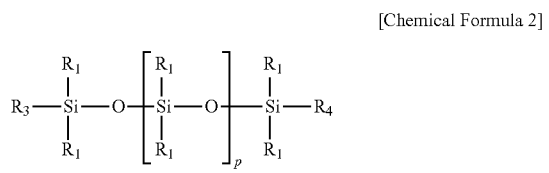

In Chemical Formula 2, $R_1$ is independently an alkyl group having a carbon number of 1 to 3; at least one of $R_3$ and $R_4$ is an alkyl group having a carbon number of 1 to 3, and the other is a hydroxyl group, an alkylene alcohol having a carbon number of 1 to 10, an epoxy group, an amino group, a thiol group, or a carboxyl group, or $R_3$ and $R_4$ are independently a hydroxyl group, an alkylene alcohol having a carbon number of 1 to 10, an epoxy group, an amino group, a thiol group, or a carboxyl group; and p is an integer of 0 to 500.

Specific examples of the polyether modified hydroxyl functional polydimethylsiloxane may include commercially available products such as BYK-SILCLEAN 3720 and the like, but are not limited thereto.

Specific examples of the organic solvent included in the silicon compound oil including at least one functional group, although not specifically limited, may include alcohols, ethers, acetates, or ketones.

The silicon compound oil including at least one reactive functional group may have a viscosity of 10 mm²/s to 20,000 mm²/s at 25° C.

Meanwhile, as the adhesive binder, a polymer resin known to be used for forming an adhesive layer of a dicing film may be used without specific limitations, and for example, a polymer resin substituted with a specific reactive functional group or a polymer resin having a main chain including a reactive functional group may be used.

Specifically, the adhesive binder may include a (meth) acrylate polymer or a (meth)acrylate copolymer unsubstituted or substituted with at least one functional group selected from the group consisting of a hydroxyl group, an isocyanate group, a vinyl group, and a (meth)acrylate group.

The adhesive binder may be an embedded adhesive binder added with acrylate having a carbon-carbon double bond to a main chain of a (meth)acrylate resin. For example, as the embedded adhesive binder, a polymer resin added with 1 wt % to 45 wt % of a (meth)acrylate functional group as a side chain to a main chain of (meth)acrylate base resin may be used.

The adhesive binder may include a polymer resin having a weight average molecular weight of 100,000 to 1,500,000.

Specifically, the (meth)acrylate polymer or (meth)acrylate copolymer unsubstituted or substituted with at least one functional group selected from the group consisting of a hydroxyl group, an isocyanate group, a vinyl group, and a (meth)acrylate group may have a weight average molecular weight of 100,000 to 1,500,000.

As used herein, (meth)acrylate means to include both acrylate and (meth)acrylate.

Examples of the (meth)acrylate polymer or (meth)acrylate copolymer may include a polymer or copolymer of (meth)acrylic acid ester monomers and monomers containing a crosslinkable functional group.

Herein, examples of the (meth)acrylic acid ester monomers may include alkyl (meth)acrylate, and more specifically, examples of the monomers having a C1-20 alkyl group may include pentyl (meth)acrylate, n-butyl (meth)acrylate, ethyl (meth)acrylate, methyl (meth)acrylate, hexyl (meth)acrylate, n-octyl (meth)acrylate, isooctyl (meth)acrylate, 2-ethylhexyl (meth)acrylate, dodecyl (meth)acrylate or decyl (meth)acrylate, or a mixture of two or more kinds thereof. As a monomer having a higher alkyl number is used, the glass transition temperature of the final copolymer decreases, and thus, appropriate monomers may be selected according to a desired glass transition temperature.

Examples of the monomers containing a crosslinkable functional group may include a hydroxyl group containing monomers, a carboxyl group containing monomers, nitrogen containing monomers, or a mixture of two or more kinds thereof. Examples of the hydroxyl group containing compound may include 2-hydroxyethyl (meth)acrylate, 2-hydroxypropyl (meth)acrylate, and the like, examples of the carboxyl group containing compound may include (meth) acrylic acid and the like, and examples of the nitrogen containing monomers may include (meth) acrylonitrile, N-vinyl pyrrolidone, N-vinyl caprolactam, and the like, but are not limited thereto. The (meth)acrylate-based resin may further include vinyl acetate, a styrene, an acrylonitrile carbon-carbon double bond-containing low molecular weight compound, and the like, in terms of improvement in other performance such as compatibility and the like.

The embedded adhesive binder added with acrylate having a carbon-carbon double bond to the main chain of a (meth)acrylate resin may have a weight average molecular weight of 100,000 to 1,500,000.

If the weight average molecular weight of the polymer resin included in the adhesive binder is too low, coatability or cohesiveness of the composition for forming an adhesive layer of a dicing film according to the above embodiment may be degraded, and when delaminating an adhesive layer formed from the composition, a residue may remain in the adherend or the adhesive layer may be broken.

If the weight average molecular weight of the polymer resin included in the adhesive binder is too high, UV curing of the composition for forming an adhesive layer of a dicing film according to the above embodiment may not sufficiently occur, and thus peel strength of an adhesive layer formed from the composition may not be sufficiently lowered to decrease the pick-up success rate.

The composition for forming an adhesive layer of a dicing film may further include a UV curable compound.

The kinds of the UV curable compound are not specifically limited, and for example, multifunctional compounds having weight average molecular weight of about 500 to 300,000 (e.g., a multifunctional urethane acrylate, a multifunctional acrylate monomer or oligomer, and the like) may be used. One of ordinary knowledge in the art can easily select appropriate compounds according to desired use.

The content of the UV curable compound may be 5 parts by weight to 400 parts by weight, preferably 10 parts by weight to 200 parts by weight, based on 100 parts by weight of the above-explained adhesive binder. If the content of the UV curable compound is less than 5 parts by weight, an adhesion decrease after curing may not be sufficient and thus pick-up may be degraded, and if it is greater than 400 parts by weight, cohesiveness of the adhesive before UV irradiation may be insufficient, or there is a concern that delamination with a release film and the like may not be easily achieved.

Specific examples of the photoinitiator included in the composition for forming an adhesive layer of a dicing film are not specifically limited, and commonly known photoinitiators may be used without specific limitations. As examples, as the photoinitiator, benzoins and alkylethers thereof, acetophenones, anthraquinones, thioxanthines, benzophenones, α-aminoacetophenones, acylphosphine oxides, oxime esters, or a mixture of two or more kinds thereof may be used.

The amount of the photoinitiator may be determined considering physical properties and characteristics of the prepared adhesive layer and the kinds and characteristics of the used adhesive binder and the like, and for example, the composition for forming an adhesive layer of a dicing film may include 0.01 to 5 parts by weight of the photoinitiator, based on 100 parts by weight of the adhesive binder.

The composition for forming an adhesive layer of a dicing film may further include a curing agent. When the composition for forming an adhesive layer of a dicing film is coated on a base film, the curing agent may react with the reactive group of the adhesive binder at room temperature or at a temperature of 30 to 50° C. to form a crosslink. The specific reactive groups included in the curing agent may remain unreacted, and may be further crosslinked through UV irradiation before pick-up, thus decreasing adhesion strength of the adhesive layer.

The curing agent may include at least one selected from the group consisting of an isocyanate compound, an aziridine compound, an epoxy compound, and a metal chelate compound.

The amount of the curing agent may be determined considering physical properties and characteristics of the prepared adhesive layer and the kinds and characteristics of the used adhesive binder and the like, and for example, the composition for forming an adhesive layer of a dicing film may include 0.1 to 30 parts by weight of the curing agent, based on 100 parts by weight of the adhesive binder.

According to another embodiment, a dicing film including a base film and an adhesive layer formed on at least one side of the base film is provided, wherein the adhesive layer includes the composition for forming an adhesive layer of a dicing film according to the above-explained embodiment.

The kinds of the base film are not specifically limited, and for example, plastic films or metal foils and the like known in this field may be used. For example, the base film may include a low density polyethylene, a linear polyethylene, a medium density polyethylene, a high density polyethylene, a super low density polyethylene, a polypropylene random copolymer, a polypropylene block copolymer, a homopolypropylene, polymethylpentene, an ethylene-vinyl acetate copolymer, an ethylene-methacrylic acid copolymer, an ethylene-methylmethacrylate copolymer, an ethylene-ionomer copolymer, an ethylene-vinyl alcohol copolymer, polybutene, a styrene copolymer, or a mixture of two or more kinds thereof. The base film including a mixture of two or more kinds of the polymers includes both a stacked structure of two or more films respectively including the above-explained polymers, and a single layer of a film including two or more kinds of the above-explained polymers.

The thickness of the base film is not specifically limited, and commonly, it may be formed to a thickness of 10 μm to 200 μm, preferably 50 μm to 180 μm. If the thickness is less than 10 μm, control of cut depth may be unstable in a dicing process, and if it is greater than 200 μm, burrs may be generated in quantity in a dicing process, or elongation may decrease, and thus an expanding process may not be exactly achieved.

The base film, if necessary, may be subjected to a common physical or chemical treatment such as matt treatment, corona discharge, primer treatment, crosslinking, and the like.

The thickness of the adhesive layer may be 0.5 μm to 50 μm, or 5 μm to 30 μm.

The details of the composition for forming an adhesive layer of a dicing film that is included in the adhesive layer includes all the contents explained above.

According to still another embodiment of the invention, a dicing die bonding film including the dicing film, and a bonding layer formed on at least one side of the dicing film, are provided.

The details of the dicing film includes all the contents explained above.

The bonding layer may include an epoxy resin, a low elastic high molecular weight resin, and a curing agent for the bonding layer. The epoxy resin may include a common epoxy resin for adhesive known in this field, and for example, an epoxy resin containing two or more epoxy groups in the molecule and having a weight average molecular weight of 100 to 5000 may be used.

The epoxy resin may form a hard crosslink structure through a curing process to exhibit an outstanding adhesion property, heat resistance, and mechanical strength.

More specifically, as the epoxy resin, it is particularly preferable to use those having an epoxy equivalent of 100 to 1000. If the epoxy equivalent of the epoxy resin is less than 100, crosslinking density may become too high, and thus the bonding film may exhibit generally hard properties, and if the epoxy equivalent of the epoxy resin is greater than 1000, heat resistance may be degraded.

Specific examples of the epoxy resin may include a difunctional epoxy resin such as bisphenol A epoxy resin or bisphenol F epoxy resin and the like; or a multifunctional epoxy resin having 3 or more functional groups such as a cresol novolac epoxy resin, a phenol novolac epoxy resin, a tetrafunctional epoxy resin, a biphenyl-type epoxy resin, a triphenolmethane-type epoxy resin, an alkyl modified triphenolmethane-type epoxy resin, a naphthalene-type epoxy resin, a dicylopentadiene-type epoxy resin, a dicylcopentadiene modified phenol-type epoxy resin, and the like, or a mixture of two or more kinds thereof, but are not limited thereto.

It is preferable to use a mixed resin of a difunctional epoxy resin and a multifunctional epoxy resin as the epoxy resin.

The [multifunctional epoxy resin] means an epoxy resin having 3 or more functional groups. That is, a difunctional epoxy resin generally has excellent flexibility and high temperature flowability and the like, but has inferior heat resistance and curing speed, while a multifunctional epoxy resin having 3 or more functional groups has a rapid curing speed and exhibits outstanding heat resistance due to high crosslinking density, but has inferior flexibility and flowability. Thus, by appropriately mixing the two kinds of resins, scattering of chips or incidence of burrs may be inhibited in a dicing process, while controlling elasticity and tack property of the bonding layer.

The low elastic high molecular weight resin may form a soft segment in the adhesive to afford stress relaxation at a high temperature. As the high molecular weight resin, any resin may be used as long as it does not induce breaking when blended with the epoxy resin to form a film, can exhibit visco-elasticity after forming a crosslinking structure, and has excellent compatibility with other components and storage stability.

Specific kinds of the low elastic high molecular weight resin are not specifically limited as long as they satisfy the above-explained properties, but for example, polyimide, polyether imide, polyester imide, polyamide, polyether sulfone, polyether ketone, polyolefin, polyvinyl chloride, phenoxy, reactive acrylonitrile butadiene rubber, a (meth)acrylate based resin, and the like, or a mixture of two or more kinds thereof, may be used.

Specific examples of the (meth)acrylate based resin may include acryl based copolymer including (meth)acrylic acid and derivatives thereof, wherein examples of the (meth) acrylic acid and derivatives thereof may include (meth) acrylic acid, an alkyl (meth)acrylate containing a C1-12 alkyl group such as methyl (meth)acrylate or ethyl (meth) acrylate and the like, (meth)acrylonitrile or (meth)acrylamide, and other copolymerizable monomers.

The (meth)acrylate-based resin may include one kind or two or more kinds of functional groups such as a glycidyl group, a hydroxyl group, a carboxyl group, an amine group, and the like, which can be introduced by copolymerizing monomers such as glycidyl (meth)acrylate, hydroxyl (meth) acrylate, hydroxyethyl (meth)acrylate, carboxy (meth)acrylate, or the like.

The curing agent that can be included in the adhesive composition is not specifically limited as long as it can react with the epoxy resin and/or low elastic high molecular weight resin to form a crosslinking structure. For example, a curing agent capable of reacting with the two components to form a crosslinking structure may be used, and such a curing agent forms crosslinking structures respectively with soft segments and hard segments in the adhesive to improve heat resistance, and simultaneously, acts as a crosslinking agent of both segments at the interface thereof to improve reliability of a semiconductor package.

The thickness of the bonding layer, although not specifically limited, may be 1 μm to 100 μm, or 3 μm to 50 μm, for example.

According to yet another embodiment, a semiconductor wafer including the bonding layer of the dicing die bonding film attached to one side is provided, wherein the base film of the dicing die bonding film is fixed to a wafer ring frame.

The above semiconductor wafer may be prepared by laminating the bonding part of a dicing die bonding film to the back side of a semiconductor wafer at a temperature of 0° C. to 180° C., and fixing the base film to a wafer ring frame.

According to yet another embodiment of the invention, a semiconductor device is provided, including: a wiring board; a bonding layer of the above-explained bonding film for a semiconductor, formed on the chip loading side of the wiring board; and semiconductor chips loaded on the bonding layer.

The above semiconductor device may be prepared by the following process. Specifically, a semiconductor wafer having the above-explained dicing die bonding film attached thereto is completely cut using a dicing apparatus to separate individual chips. Thereafter, the adhesion part is cured by UV irradiation or heating and the like. The adhesive cured by UV or heat has lowered adhesion strength, thus facilitating pick-up of chips in a following process. Herein, if necessary, an expanding process for tensioning a dicing die bonding film is conducted, so as to expand the distance between chips and generate dislocation at the interface of the bonding part and the adhesion part, thus facilitating pick-up.

If pick-up of chips is conducted under the above conditions, the semiconductor wafer and the bonding part are delaminated from the adhesion part to obtain chips having only bonding layers attached thereto. The obtained chip having a bonding layer is attached to a substrate for a semiconductor. The temperature for attaching chips is commonly 100° C. to 180° C., the time for attaching is 0.5 seconds to 3 seconds, and the pressure for attaching is 0.5 kgf/cm$^2$ to 2 kgf/cm$^2$.

After progressing the above processes, wire bonding and molding processes are conducted to obtain a semiconductor device. In the present invention, particularly, through optimization of strength of adhesion for die bonding and the like, delamination, slipping, or inclining of chips and the like may be inhibited in a wire bonding or molding process without conducting a pre-curing process after the die bonding.

The method for preparing a semiconductor device is not limited to the above process, any process may be included, and the order of the process may be changed. For example, the process may be progressed in the order of UV curing, dicing, and expanding, or in the order of dicing, expanding, and UV curing. After the attaching of the chip, a heating or cooling process may be further conducted.

Meanwhile, according to yet another embodiment of the invention, a method for dicing a semiconductor wafer is provided, including the steps of: conducting pre-treatment by partially treating a semiconductor wafer including the above dicing die bonding film and a wafer laminated on at least one side of the dicing die bonding film so that it is completely cut or it can be cut; expanding the semiconductor wafer after the pre-treatment step; and irradiating UV to the base film of the expanded semiconductor wafer, and picking up individual chips separated by cutting of the semiconductor wafer.

The details of the dicing die bonding film include the all the contents explained above.

Except the details of the steps of the dicing method, commonly known apparatuses used for dicing of a semiconductor wafer, dicing methods, and the like may be used without specific limitations.

By using the dicing die bonding film including a dicing film, incidence of burrs may be minimized during a dicing process of a semiconductor wafer to prevent pollution of semiconductor chips and improve reliability and lifespan of semiconductor chips.

Specific embodiments of the invention will be explained in detail in the following examples. However, these examples are only to illustrate specific embodiments of the invention, and the scope of the invention is not limited thereto.

EXAMPLE 1

Based on 100 parts by weight of a photo-curable adhesive binder resin, 2 parts by weight of an isocyanate based curing agent (multifunctional isocyanate oligomer), 0.5 parts by weight of a silicon compound oil X-22-4309 (Shin-Etsu Co. Ltd.), and 1 part by weight of DAROCUR TPO as a photoinitiator were mixed to prepare a UV-curable adhesive composition. As the photocurable adhesive binder resin, a polymer resin added with 20 wt % of acrylate functional groups as a side chain to the main chain of an acrylic base resin (Mw 300,000) was used.

The UV-curable adhesive composition was coated on one side of a 100 um thick polyolefin film, and dried to prepare a dicing film including a 10 um thick adhesive layer.

EXAMPLE 2

Based on 100 parts by weight of photo-curable adhesive binder resin, 2 parts by weight of an isocyanate based curing agent (multifunctional isocyanate oligomer), 0.5 parts by weight of a silicon compound oil KF-1001 (Shin-Etsu Co. Ltd.), and 1 part by weight of DAROCUR TPO as a photoinitiator were mixed to prepare a UV-curable adhesive composition. As the photocurable adhesive binder resin, a polymer resin added with 20 wt % of acrylate functional groups as a side chain to the main chain of an acrylic base resin (Mw 300,000) was used.

The UV-curable adhesive composition was coated on one side of a 100 um thick polyolefin film, and dried to prepare a dicing film including a 10 um thick adhesive layer.

EXAMPLE 3

Based on 100 parts by weight of a photo-curable adhesive binder resin, 2 parts by weight of an isocyanate based curing agent (multifunctional isocyanate oligomer), 0.5 parts by weight of a silicon compound oil X-KF-8008 (Shin-Etsu Co. Ltd.), and 1 part by weight of DAROCUR TPO as a photoinitiator were mixed to prepare a UV-curable adhesive composition. As the photocurable adhesive binder resin, a polymer resin added with 20 wt % of acrylate functional groups as a side chain to the main chain of an acrylic base resin (Mw 300,000) was used.

The UV-curable adhesive composition was coated on one side of a 100 um thick polyolefin film, and dried to prepare a dicing film including a 10 um thick adhesive layer.

EXAMPLE 4

Based on 100 parts by weight of a photo-curable adhesive binder resin, 2 parts by weight of an isocyanate based curing agent (multifunctional isocyanate oligomer), 0.5 parts by weight of a silicon compound oil BYK-SILCLEAN, and 1 part by weight of DAROCUR TPO as a photoinitiator were mixed to prepare a UV-curable adhesive composition. As the photocurable adhesive binder resin, a polymer resin added with 20 wt % of acrylate functional groups as a side chain to the main chain of an acrylic base resin (Mw 300,000) was used.

The UV-curable adhesive composition was coated on one side of a 100 um thick polyolefin film, and dried to prepare a dicing film including a 10 um thick adhesive layer.

COMPARATIVE EXAMPLE 1

Based on 100 parts by weight of a photo-curable adhesive binder resin, 2 parts by weight of an isocyanate based curing agent (multifunctional isocyanate oligomer), and 1 part by weight of DAROCUR TPO as a photoinitiator were mixed to prepare a UV-curable adhesive composition. As the photocurable adhesive binder resin, a polymer resin added with 20 wt % of acrylate functional groups as a side chain to the main chain of an acrylic base resin (Mw 300,000) was used.

The UV-curable adhesive composition was coated on one side of a 100 urn thick polyolefin film, and dried to prepare a dicing film including a 10 um thick adhesive layer.

COMPARATIVE EXAMPLE 2

Based on 100 parts by weight of a photo-curable adhesive binder resin, 2 parts by weight of an isocyanate based curing agent (multifunctional isocyanate oligomer), 5 parts by weight of a silicon compound oil X-22-4039 (Shin-Etsu Co. Ltd.), and 1 part by weight of DAROCUR TPO as a photoinitiator were mixed to prepare a UV-curable adhesive composition. As the photocurable adhesive binder resin, a polymer resin added with 20 wt % of acrylate functional groups as a side chain to the main chain of acrylic base resin (Mw 300,000) was used.

The UV-curable adhesive composition was coated on one side of a 100 um thick polyolefin film, and dried to prepare a dicing film including a 10 um thick adhesive layer.

COMPARATIVE EXAMPLE 3

Based on 100 parts by weight of a photo-curable adhesive binder resin, 2 parts by weight of an isocyanate based curing agent (multifunctional isocyanate oligomer), 0.5 parts by weight of a silicon compound oil L-7500 (Silvet Co.), and 1 part by weight of DAROCUR TPO as a photoinitiator were mixed to prepare a UV-curable adhesive composition.

The UV-curable adhesive composition was coated on one side of a 100 urn thick polyolefin film, and dried to prepare a dicing film including a 10 um thick adhesive layer.

EXPERIMENTAL EXAMPLE

The peel strengths, tack forces and pick up success rates of the dicing films prepared in Examples 1 to 4 and Comparative Examples 1 to 3 were measured as follows, and the results are shown in the following Tables 1 and 2.

1. Measurement of 180 Degree Peel Strength Between Die Bonding Film/Dicing Film (Before/after UV Curing)

In order to measure peel strength between a die bonding film and a PSA layer, a bonding film was laminated with a dicing film at room temperature, allowed to stand for 1 hour, a sample with a width of 25 mm was manufactured, and 180 degree peel strength was measured at a speed of 300 mm/min, and additionally, the value after UV curing was measured. The measurement was conducted three or more times per one sample, and the mean value was recorded.

2. Measurement of 90 Degree Peel Strength Between SUS/Dicing Film (Before UV Curing)

A dicing film having a width of 25 mm was prepared, and attached to an adherend of SUS 304. After 1 hour of curing, 90 degree peel strength was measured at a speed of 300 mm/min. The measurement was conducted three or more times per one sample, and the mean value was recorded.

3. Tack Test (Before/after UV Curing)

The dicing film was put on a plate so that the adhesive layer faced upward, and tack force was measured using a ball type probe having a diameter of 1 inch. Herein, the force applied to the probe was 800 gf, the contact time was 0.01 second, the measurement speed for tearing off the probe was 1 mm/s, and the apparatus used for measurement was a Texture Analyzer.

4. Measurement of Pick-Up Success Rate

The dicing die bonding films prepared from the dicing films of examples and comparative examples were laminated with wafers at 70° C. Subsequently, a dicing process was conducted using a dicing apparatus (manufactured by NEON Company) under the following conditions, and then UV was irradiated to the dicing film side under the following conditions. Thereafter, 200 chips were picked up with a die bonder (Shinkawa Co. Ltd.), and the number of non-picked-up chips was measured and recorded as a percent.

[Dicing Conditions]
Blade: 27HEDD
Blade rotation speed: 40,000 rpm
Speed: 30 mm/s
Chip size: 10 mm×10 mm
Cut depth: 70 um
[UV Irradiation Conditions]
Lamp: metal halide type
Intensity of illumination: 70 mW/cm² (measured with UV meter)
Irradiation amount: 200 mJ/cm² or more (measured with UV meter)
[Pick Up Conditions]
Expanding: 4 mm
Pin height: 0.15 mm
Pick up strength: 100 gf 5. Die Shear Strength A wafer having a 500 um thickness coated with a dioxide layer was cut to a size of 5 mm×5 mm, and laminated with a dicing die bonding film at 60° C., followed by UV irradiation to remove the dicing film and cutting to leave only a bonding film of a chip size. The upper chip of a 5 mm×5 mm size was put on the lower chip of a 10 mm×10 mm size, and then pressed with force of 2 kgf for 2 seconds on a hot plate at 130° C., followed by curing at 125° C. for 1 hour. The above manufactured test piece was cured at 175° C. for 2 hours, and then die shear strength of the upper chip was measured at 250° C.

TABLE 1

| | | Example 1 | Example 2 | Example 3 | Example 4 |
|---|---|---|---|---|---|
| 180 degree peel strength (unit: gf/25 mm) | Before UV irradiation | 347.7 | 397.2 | 394.6 | 352.1 |
| | After UV irradiation | 8.9 | 9.1 | 9.4 | 8.6 |
| SUS peel strength (unit: gf/25 mm) | | 172.3 | 168.7 | 183.3 | 165.5 |
| Tack force (unit: gf) | Before UV irradiation | 162.2 | 170.2 | 173.5 | 160.3 |
| | After UV irradiation | 0.62 | 0.64 | 0.70 | 0.60 |
| Pick-up success rate (%) | | 100 | 100 | 100 | 100 |
| Die shear strength (unit: kgf/chip) | | 10.6 | 9.8 | 10.2 | 10.5 |

TABLE 2

| | | Comparative Example 1 | Comparative Example 2 | Comparative Example 3 |
|---|---|---|---|---|
| 180 degree peel strength (unit: gf/25 mm) | Before UV irradiation | 492.5 | 175.4 | 189.1 |
| | After UV irradiation | 11.2 | 8.5 | 8.7 |
| SUS peel strength (unit: gf/25 mm) | | 267.2 | 105.1 | 112.0 |
| Tack force (unit: gf) | Before UV irradiation | 209.3 | 84.7 | 91.5 |
| | After UV irradiation | 1.54 | 0.52 | 0.55 |
| Pick up success rate (%) | | 89.5 | 100 | 100 |
| Die shear strength (unit: kgf/chip) | | 10.5 | 5.2 | 5.8 |

As shown in the Table 1 and Table 2, it was confirmed that the dicing films prepared in Examples 1 to 4 exhibit relatively low 180 degree peel strength and tack force before/after UV curing, relatively low SUS peel strength, and high pick-up success rate, compared to the dicing film prepared in Comparative Example 1.

Furthermore, it was confirmed that the dicing films prepared in Examples 1 to 4 exhibit relatively high die shear strength compared to the dicing films prepared in Comparative Examples 1 to 3, to prevent delamination due to a decrease in adhesion strength, thus inhibiting reflow cracks and improving reliability of a semiconductor manufacturing process.

What is claimed is:

1. A composition for forming an adhesive layer of a dicing film, comprising:
    a silicon compound oil; an adhesive binder; and a photoinitiator,
    wherein a weight ratio of the silicon compound oil to the adhesive binder is 0.01% to 4.5%,
    wherein the silicon compound oil comprises at least one silicon compound selected from the group consisting of a silicon compound of the following Chemical Formula 1, a silicon compound of the following Chemical Formula 2, and a polyether modified hydroxy functional polydimethylsiloxane; and an organic solvent:

[Chemical Formula 1]

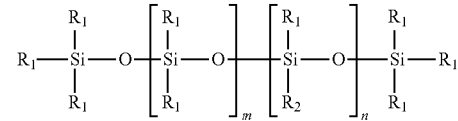

wherein, in Chemical Formula 1, $R_1$ is independently an alkyl group having a carbon number of 1 to 3, $R_2$ is a hydroxyl group, an alkylene alcohol having a carbon number of 1 to 10, an epoxy group, an amino group, a thiol group, or a carboxyl group, m is an integer of 0 to 500, and n is an integer of 1 to 500,

[Chemical Formula 2]

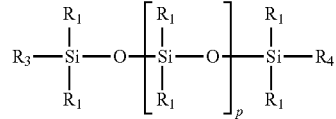

wherein, in Chemical Formula 2, $R_1$ is independently an alkyl group having a carbon number of 1 to 3,
at least one of $R_3$ and $R_4$ is an alkyl group having a carbon number of 1 to 3, and the other is an alkylene alcohol having a carbon number of 1 to 10, an epoxy group, an amino group, a thiol group, or a carboxyl group, or $R_3$ and $R_4$ are independently a hydroxyl group, an alkylene alcohol having a carbon number of 1 to 10, an epoxy group, an amino group, a thiol group, or a carboxyl group, and p is an integer of 0 to 500.

2. The composition for forming an adhesive layer of a dicing film according to claim 1, wherein the organic solvent is selected from alcohols, ethers, acetates, or ketones.

3. The composition for forming an adhesive layer of a dicing film according to claim 1, wherein the silicon compound oil has a viscosity of 10 mm$^2$/s to 20,000 mm$^2$/s at 25° C.

4. The composition for forming an adhesive layer of a dicing film according to claim 1, wherein the adhesive binder includes a (meth)acrylate polymer or a (meth)acrylate copolymer unsubstituted or substituted with at least one functional group selected from the group consisting of a hydroxyl group, an isocyanate group, a vinyl group, and a (meth)acrylate group.

5. The composition for forming an adhesive layer of a dicing film according to claim 1, wherein the adhesive binder includes an embedded adhesive binder added with an acrylate having a carbon-carbon double bond to a main chain of a (meth)acrylate resin.

6. The composition for forming an adhesive layer of a dicing film according to claim 1, wherein the adhesive binder includes a polymer resin having a weight average molecular weight of 100,000 to 1,500,000.

7. The composition for forming an adhesive layer of a dicing film according to claim 1, wherein the photoinitiator includes at least one selected from the group consisting of benzoins and alkylethers thereof, acetophenones, anthraquinones, thioxanthines, benzophenones, α-aminoacetophenones, acylphosphine oxides, and oxime esters.

8. The composition for forming an adhesive layer of a dicing film according to claim 1, wherein the composition comprises 0.01 to 8 parts by weight of the photoinitiator, based on 100 parts by weight of the adhesive binder.

9. The composition for forming an adhesive layer of a dicing film according to claim 1, further comprising a curing agent.

10. The composition for forming an adhesive layer of a dicing film according to claim 9, wherein the curing agent includes at least one selected from the group consisting of an isocyanate compound, an aziridine compound, an epoxy compound, and a metal chelate compound.

11. The composition for forming an adhesive layer of a dicing film according to claim 9, wherein the composition comprises 0.1 to 30 parts by weight of the curing agent, based on 100 parts by weight of the adhesive binder.

12. A dicing film comprising a base film, and an adhesive layer formed on at least one side of the base film, wherein the adhesive layer comprises the composition for forming an adhesive layer of a dicing film of claim 1.

13. The dicing film according to claim 12,
wherein a thickness of the base film is 10 μm to 200 μm, and
a thickness of the adhesive layer is 0.5 μm to 50 μm.

14. A dicing die bonding film comprising the dicing film of claim 12, and a bonding layer formed on at least one side of the dicing film.

15. A method for dicing a semiconductor wafer comprising the steps of:
conducting pre-treatment by partially treating a semiconductor wafer comprising the dicing die bonding film of claim 14 and a wafer laminated on at least one side of the dicing die bonding film so that it is completely cut or it can be cut;
expanding the semiconductor wafer after the pre-treatment; and
irradiating UV to the base film of the expanded semiconductor wafer, and picking up individual chips separated by cutting of the semiconductor wafer.

* * * * *